United States Patent [19]

Foley et al.

[11] 4,392,172

[45] Jul. 5, 1983

[54] REACTIVE SNUBBER FOR INDUCTIVE LOAD CLAMP DIODES

[75] Inventors: James W. B. Foley, Peru; David J. Osterhout, Adams, both of Mass.

[73] Assignee: General Electric Company, Salem, Va.

[21] Appl. No.: 312,526

[22] Filed: Oct. 19, 1981

[51] Int. Cl.³ .............................................. H02H 9/04
[52] U.S. Cl. ......................................... 361/8; 361/56; 361/91; 361/111; 361/159
[58] Field of Search ..................... 361/2, 8, 13, 91, 56, 361/110, 111, 159; 323/282; 307/252 M; 363/17, 50, 56, 124, 131, 132, 133, 134, 138

[56] References Cited

U.S. PATENT DOCUMENTS 3,189,796  6/1965  Tipton ................................ 361/159
3,968,420  7/1976  Yoshida ...................... 307/252 M X
4,365,171  12/1982  Archer .

FOREIGN PATENT DOCUMENTS 1923110  11/1970  Fed. Rep. of Germany ...... 363/124

OTHER PUBLICATIONS

"Snubber Circuit Design Calculations"; Tobin et al., General Electric Company, Semiconductor Design and Application Guidebook, Nov. 1975.
"Reducing Diode Reverse Recovery Current", Bauman, *IBM Tech. Disc. Bulletin*, vol. 18, No. 5, pp. 1493-1494, 10/75.
"Transistorised PWM Inverter Asynchronous Motor Drive", Schmidt et al., International Conf. on Elec. Machines, Athens, Greece, 9/80.

*Primary Examiner*—Harry E. Moose, Jr.
*Attorney, Agent, or Firm*—Ormand R. Austin; James H. Beusse; Arnold E. Renner

[57] ABSTRACT

A saturable reactor snubber to improve the recovery characteristics of a clamp diode used in a power switching circuit is provided with a secondary winding to permit saturating the reactor via a secondary current pulse in order to improve the turn-on speed of the clamp diode. The current pulse for saturating the reactor at turn-on is preferably derived from a shunt snubber charging pulse or from an external generator synchronized to the turn-off time of a power switching device in the switching circuit.

6 Claims, 4 Drawing Figures

REACTIVE SNUBBER FOR INDUCTIVE LOAD CLAMP DIODES

The United States Government has rights in this invention pursuant to Contract No. N00024-79-C-6276 awarded by the Department of the Navy.

BACKGROUND OF THE INVENTION

The subject invention generally relates to power switching circuits utilizing semiconductors with inductive loads and, more particularly, to improvements in snubbing techniques for power diodes used to clamp inductive voltages.

In applications such as, for example, a switching power supply, a switch regulates current through an inductive load by opening and closing at a controlled rate. The switch may be mechanical or solid-state, such as a transistor or thyristor. During the time period when the switch is non-conductive, current continues to flow through the inductive load by virtue of a current path normally established by a free-wheeling or clamp diode connected across the load. The diode provides a current path and serves to limit or clamp the inductive voltage developed by the load.

When the switch is gated into conduction, with load current in the clamp diode, current is transferred from the diode to the switch at a rate which is limited only by the source voltage and the circuit inductance until the peak reverse current of the diode is reached. At this point, the diode tends to snap off at even higher rates of change of current, generating high voltage transients from the energy stored in the stray inductance of the free-wheeling current path. With fast turn-off diodes, the voltage transients are often oscillatory due to the stray inductance ringing with the diode capacitance. In power circuits, without snubbing, these transients can radiate considerable electromagnetic interference (EMI) and can also exceed the reverse blocking voltage of the diode, causing self-destruction.

The recovery characteristics of a diode are depicted by the solid line on the graph of FIG. 1. The rate of change of current during commutation is a function of circuit parameters and, more specifically, of the applied voltage and the total series inductance according to the following formula: $(di/dt) = -(E/L)$, where $(di/dt)$ is rate of change of current, E represents the magnitude of applied voltage and L represents total series inductance.

Before complete turn-off is attained, the diode current must reverse in order to sweep out the stored charge in the device. The peak reverse recovery current (Irr) is directly proportional to the rate of change of current since the area under the negative portion of the graph remains nearly constant for a given charge. In high speed switching circuits, the peak reverse currents can become excessively high and are generally snubbed by various circuit modifications.

One technique for reducing these currents is to reduce the rate of change of current as the current level approaches zero. This can be achieved by connecting a saturable reactor in series with the diode. The reactor comes out of magnetic saturation at low current levels, thereby inserting a larger series inductance, which results in the modification of the current waveform to that illustrated by the dotted line in FIG. 1. The schematic diagram of FIG. 2 is a prior art switching circuit utilizing this method. A variety of devices can be used to perform the switching function of switch 12, but commonly a bipolar power transistor would be used. The switch 12 is connected in a series circuit between a reactive load 11 and a power source 18. A control circuit (not shown) supplies control signals to regulate the on and off time intervals of switch 12 in a manner well known in the art. When switch 12 is closed, current flows from the power source 18 through the series connection of the reactive load 11 and the controlling switch 12. When switch 12 opens, the energy stored in the reactive portion of the load slowly discharges through a clamp diode 13 and a saturable reactor 14 which are serially connected across the load 11. When switch 12 recloses, load current is then commutated from the clamp diode 13 to the switch 12. In addition to assuming the load current, switch 12 also passes the reverse recovery current required to turn off clamp diode 13. Just prior to completion of this commutation, reactor 14 comes out of saturation, inserting more inductance in series with the clamp diode 13 which lowers the peak recovery currents required to turn off the diode 13. This feature allows a lower current rating for switch 12.

A snubber circuit consisting of the parallel connected combination of a diode 15 and a capacitor 16 and a series connected resistor 17 is shown connected across the switch 12 and is sometimes used to absorb some of the power losses that occur each time switch 12 turns off. The shunt snubber is not mandatory if switch 12 can absorb the switching power losses.

The major disadvantage of this technique, i.e., utilizing a simple saturating reactor, is that reactor 14 is not saturated at the moment that switch 12 turns off and, therefore, presents a high inductive impedance in the clamp diode current path. To effect a commutation of load current from switch 12 to diode 13, the voltage at the junction of switch 12 and load 11 must increase to a value which is sufficient to overcome the inductance of the unsaturated reactor 14. This voltage must exceed that of the power source in proportion to the inductance presented by reactor 14 which requires an increased voltage rating for switch 12.

SUMMARY OF THE INVENTION

It is an object of this invention to provide an improved snubbing technique for a power clamp diode when used in a switching circuit.

It is another object of this invention to improve the turn-on speed of a power clamp diode when a saturable reactor device is used to improve the turn-off characteristics of the diode.

It is a further object of the invention to provide a temporal source of energy at the appropriate time with sufficient magnitude to improve the turn-on speed of a power diode connected in series with a saturable reactor.

The foregoing objects of the invention are achieved by modification of a conventional saturating reactor by providing a secondary saturation control input to the reactor. The control input is provided through a secondary winding on the reactor core. In a typical switching circuit, an external current pulse derived from a conventional shunt snubber circuit provided for switch protection is coupled to the secondary winding. The pulse of current in the shunt snubber occurs at the correct time and magnitude to perform the desired function. When a shunt snubber is not utilized, an external current pulse synchronized with the switching control signal can be coupled to the secondary winding. The current pulse through the secondary winding saturates the reactor core such that a low impedance is presented in the clamp diode circuit at the start of the clamp period.

BRIEF DESCRIPTION OF THE DRAWINGS

The specific nature of the invention, as well as other objects, aspects, uses, and advantages thereof, will clearly appear from the following description and from the accompanying drawings, in which.

DETAILED DESCRIPTION

Figure 1:
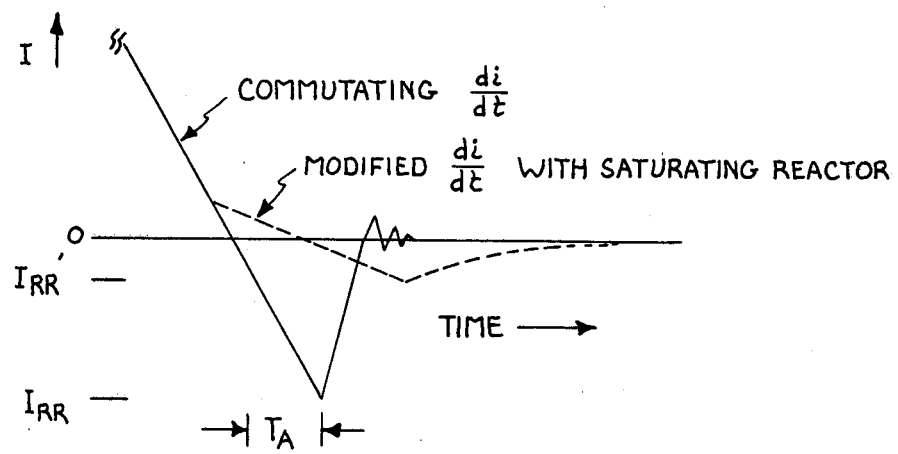
FIG. 1 is a graph of a current waveform during the recovery time of a typical power diode.
Figures 2, 3:
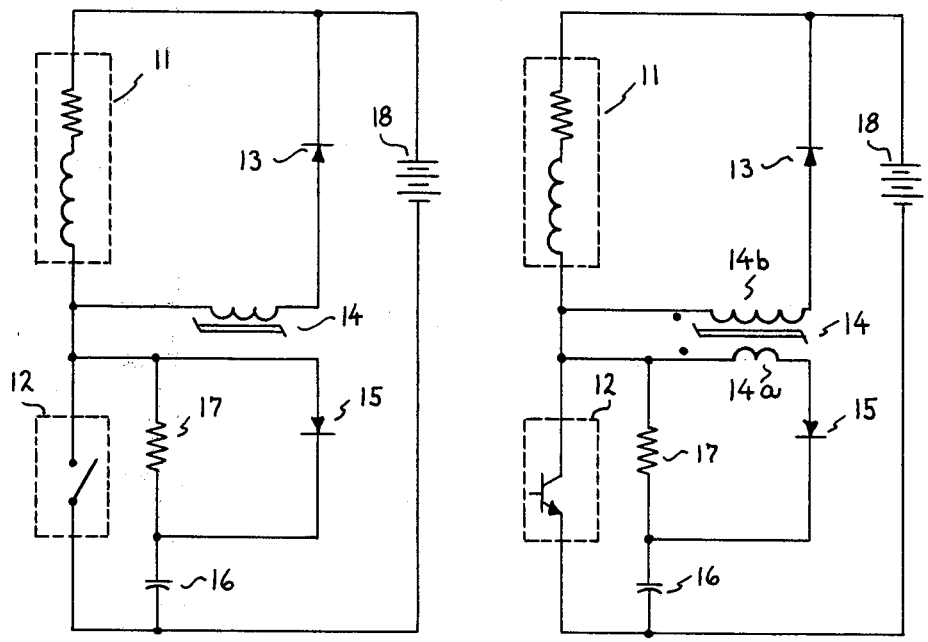
FIG. 2 is a schematic diagram of a prior art power switching circuit with a conventional saturable reactor.
FIG. 3 is a schematic diagram of a power switching circuit according to the present invention.

Reference is now made to FIG. 3 of the drawings wherein like reference numerals represent the same or similar elements as shown in the prior art circuit diagram of FIG. 2. The snubber circuit has been modified by the addition of a secondary winding 14A on the core of reactor 14, which winding 14A is connected in series with the diode 15. In typical power switching applications, such as choppers and inverters, the switching frequency is usually high enough to maintain continuous current flowing in the load 11 and in some applications may be several thousand cycles per second. When switch 12 is on, current flows through the source 18, load 11, and switch 12 and increases toward some maximum value determined by the magnitude of source voltage and load impedance. As the switch 12 opens, the load current diverts around switch 12 through the secondary winding 14A of reactor 14, diode 15, and capacitor 16 while an insignificant portion flows through resistor 17. This path for the load current is maintained until capacitor 16 becomes charged to slightly above the magnitude of the voltage of power source 18. At this point, diode 13 becomes forward biased and conducts current rapidly, transferring the load current from the snubber path to the clamp diode 13 path. Since the two windings on reactor 14, i.e., the primary winding 14B and secondary winding 14A, represent a transformer when the core is not in saturation, the polarity sense of the windings, as represented by the dots on the schematic diagram, must be observed. With the polarity sense as shown by the dots, the voltage induced across the primary winding 14B due to the initial increasing load current in the secondary winding 14A is of the polarity to reverse bias diode 13, keeping it off. The induced voltage on the primary winding 14B disappears as soon as the load current flowing in the secondary winding 14A is of sufficient magnitude to saturate the core of reactor 14. Since the reactor 14 is saturated before the voltage at the junction of load 11 and switch 12 exceeds the power source 18 voltage, diode 13 starts conducting current immediately as it becomes forward biased. When diode 13 conducts, the load current rapidly transfers from the secondary winding 14A to the primary winding 14B and the flow density, due to the net ampere-turns, increases further into saturation by an amount proportional to the turns ratio.

The current from load 11 flowing through the primary winding 14B maintains reactor 14 in saturation until switch 12 turns on again. When switch 12 conducts, the load current rapidly transfers from the clamp diode 13 path to the switch 12 path. As the current in the primary winding 14B approaches zero, the core of reactor 14 comes out of saturation which increases the inductance of the primary winding 14B slowing the rate of change of commutating current as in a simple conventional reactor. The voltage which builds up across the primary winding 14B as reactor 14 comes out of saturation is transformed to the secondary winding 14A. This voltage is made insufficient to overcome the reverse bias on the snubber diode 15 by appropriately selecting the turns ratio between windings 14B and 14A to step down the induced voltage. The reverse bias on diode 15 supplied by the charge on capacitor 16 is lowered when switch 12 is turned on by discharging capacitor 16 through resistor 17 and switch 12. This discharge time constant is made much slower than the commutation time of load current from clamp diode 13 to switch 12, thereby maintaining a significant reverse bias on diode 15 during the commutation.

The parameters for the saturable reactor are selected to minimize the inductance in series with the snubber diode 15 and to allow saturation by the load current flowing in the snubber path prior to commutation. The number of primary turns is selected to provide sufficient snubbing of the clamp diode 13 recovery characteristics when the core of reactor 14 is not in saturation. The resistor 17 is provided only to permit discharge of capacitor 16 and could be connected across diode 15 alone.

Figure 4:
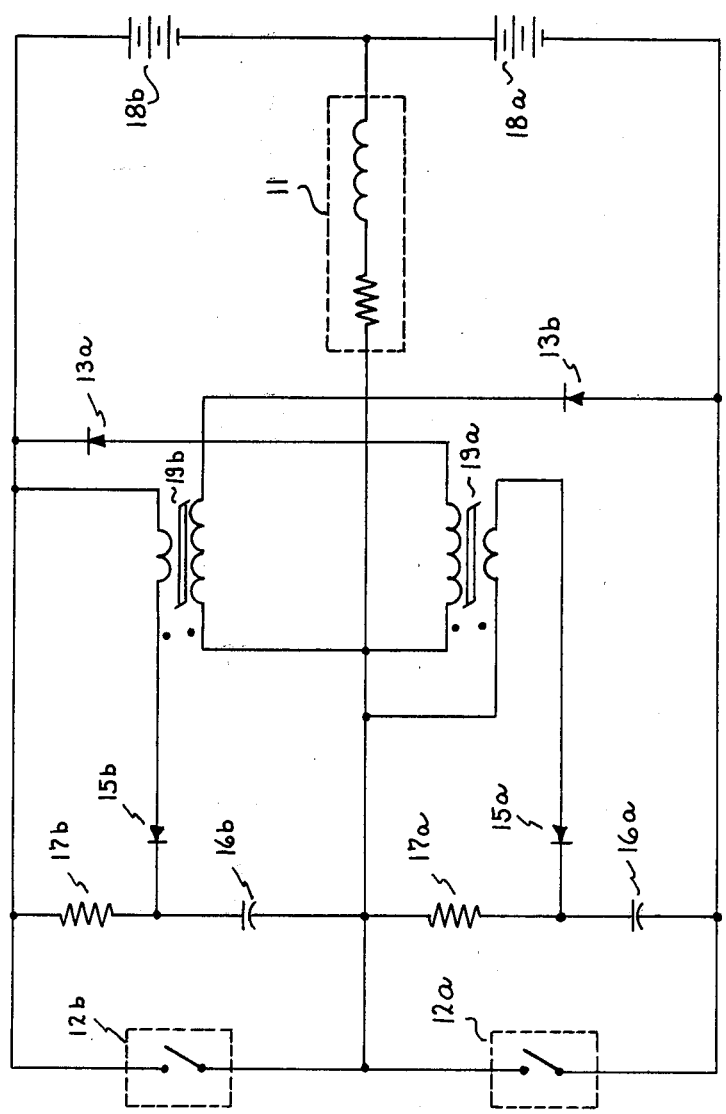
FIG. 4 is a simplified schematic diagram illustrating one embodiment of the present invention as applied to a half-bridge power inverter switching circuit configuration.

A specific embodiment of the invention as it applies to half-bridge inverter configuration is shown in FIG. 4, wherein like reference numerals perform the same or similar function of FIG. 3. Each switching device 12a and 12b is supplied with on/off switching command signals on alternate half cycles of a base frequency. All the components with an "a" designation perform the functions described for FIG. 3 during one half cycle of the base frequency, while the components with a "b" designation perform these functions on the alternate half cycles of the base frequency. Since each half of the half-bridge inverter of FIG. 4 operates independently in the manner described with respect to FIG. 3, no additional explanation of the circuit of FIG. 4 is believed necessary. However, it should be noted that when switch 12a opens, the load current circulates through power source 18b as is typical in prior art half-bridge inverters. The switching frequency for each switch 12 is typically several multiples of the base frequency and the switch 12 may be operated in a pulse width modulation mode to produce the desired base frequency response at load 11.

It will be recognized by those skilled in the art that FIG. 4 represents a half-bridge configuration, and that it is possible to provide a full-bridge configuration by simply replacing the power source center tap by two more identical power switches. Likewise, it is possible to extend this basic circuit to multi-phase systems by merely adding additional switching devices 12 arranged to connect each additional power phase to the load 11 at appropriate times.

What is claimed is:

1. An improved snubber circuit for use in a power switching circuit including at least one power switch and power clamp diode, the switching circuit being of the type responsive to control signals for connecting and disconnecting an inductive load from a power source, comprising:
(a) a saturable reactor having a primary winding and a secondary winding, said primary winding being connected in series with the clamp diode across the load, the diode being poled so as to permit continuous load current to flow when the load is disconnected from the power source by the power switch; and
(b) a shunt snubber circuit connected across the power switch, said shunt snubber circuit arranged to supply a current pulse to said secondary winding in a manner to force rapid magnetic saturation of said saturable reactor when the load is disconnected from the power source by the power switch whereby load current is rapidly transferred into the clamp diode immediately upon the clamp diode being forward biased.

2. The snubber circuit of claim 1 wherein said shunt snubber circuit connected across said power switch comprises:
(a) a diode;
(b) a capacitor;
(c) means for connecting said diode, said capacitor and said secondary winding in a series current path in parallel with the power switch, said diode being poled to provide a current path for continuous current through the load;
(d) a resistor; and
(e) means for connecting said resistor in parallel circuit with the series combination of said secondary winding and said diode to thereby provide a discharge current path for said capacitor when the switch is conductive, whereby termination of conduction of the power switch causes a current pulse to flow through said path formed by said secondary winding, said diode and said capacitor to force saturation of said reactor.

3. The snubber circuit of claim 2 wherein the power switch comprises a bipolar transistor.

4. An improved snubber circuit for use in a switching power regulator arranged in a half-bridge inverter configuration for regulating current in an inductive load, the regulator including first and second series connected switching devices and means for rendering the devices alternately conductive, first and second series connected power sources coupled across the switching devices, the inductive load being connected between a junction intermediate the power sources and a junction intermediate the switching devices, the snubber circuit comprising:
(a) first and second saturable reactors, each having a primary winding and a secondary winding;
(b) first and second clamping diodes;
(c) means for connecting said primary winding of said first reactor and said first diode in a series circuit across the second switching device;
(d) means for connecting said primary winding of said second reactor and said second diode in a series circuit across the first switching device;
(e) means for supplying a current pulse to said secondary winding of said first reactor concurrent with opening of the first switching device to thereby force rapid saturation of said first reactor to enable rapid transfer of current to a path through said first diode; and
(f) means for supplying a current pulse to said secondary winding of said second reactor concurrent with opening of the second switching device to thereby force rapid saturation of said second reactor to enable rapid transfer of current to a path through said second diode.

5. The snubber circuit of claim 4 wherein each of said means for supplying a current pulse comprises:
(a) a resistor;
(b) a capacitor;
(c) a diode;
(d) means connecting said resistor and said capacitor in a series circuit across a corresponding one of said switching devices; and
(e) means connecting said diode and a corresponding one of said secondary windings in a series current path across said resistor, whereby termination of conduction of said corresponding one of said switching devices generates a current pulse through said path formed by said diode, said secondary winding and said capacitor.

6. The snubber circuit of claim 5 wherein the switching device comprises a bipolar transistor.

* * * * *